(12) United States Patent
Chen et al.

(10) Patent No.: US 12,002,900 B2
(45) Date of Patent: Jun. 4, 2024

(54) METHOD AND DEVICE FOR FIXED CONNECTION OF SOLAR CELL STRING, AND PRESS ASSEMBLY

(71) Applicant: SUZHOU XIAONIU AUTOMATION EQUIPMENT CO., LTD., Suzhou (CN)

(72) Inventors: Shigeng Chen, Suzhou (CN); Yonggang Wu, Suzhou (CN); Qifei Ge, Suzhou (CN); Yong Yang, Suzhou (CN); Biao Yin, Suzhou (CN)

(73) Assignee: SUZHOU XIAONIU AUTOMATION EQUIPMENT CO., LTD., Suzhou (CN)

( * ) Notice: Subject to any disclaimer, the term of this patent is extended or adjusted under 35 U.S.C. 154(b) by 0 days.

(21) Appl. No.: 18/317,217

(22) Filed: May 15, 2023

(65) Prior Publication Data

US 2023/0282762 A1    Sep. 7, 2023

(30) Foreign Application Priority Data

Oct. 9, 2022  (CN) .......................... 202211224117.9

(51) Int. Cl.
*B23K 1/00*      (2006.01)
*H01L 31/05*    (2014.01)
*H01L 31/18*    (2006.01)

(52) U.S. Cl.
CPC .......... *H01L 31/188* (2013.01); *B23K 1/0008* (2013.01); *H01L 31/0504* (2013.01)

(58) Field of Classification Search
CPC ........... H01L 31/1876; H01L 21/67706; H01L 31/0504; H01L 31/188; H01L 31/0516; H01L 31/18; B23K 1/0008; B23K 1/0016; B23K 2101/40; B23K 37/0426
See application file for complete search history.

(56) References Cited

U.S. PATENT DOCUMENTS

| | | | |
|---|---|---|---|
| 9,530,924 B2 * | 12/2016 | Tabe | H01L 31/188 |
| 11,611,006 B2 * | 3/2023 | Hosken | H01L 31/044 |
| 2006/0219290 A1 * | 10/2006 | Okamoto | H01L 31/188 |
| | | | 136/244 |
| 2009/0056784 A1 * | 3/2009 | Reinisch | H01L 31/0516 |
| | | | 136/244 |
| 2010/0000603 A1 * | 1/2010 | Tsuzuki | B32B 17/10018 |
| | | | 136/259 |
| 2012/0085812 A1 * | 4/2012 | Luechinger | H01L 31/0504 |
| | | | 228/110.1 |

(Continued)

FOREIGN PATENT DOCUMENTS

| | | |
|---|---|---|
| CN | 113437177 A | 9/2021 |
| CN | 214123900 U | 9/2021 |
| CN | 113937190 A | 1/2022 |

*Primary Examiner* — Erin B Saad

(57) ABSTRACT

A method for fixed connection of a solar cell string includes: stacking a back film, a first solder ribbon, a solar cell, a second solder ribbon and a front film to form a solar cell unit; placing a first press and a second press on the front film such that the first press and second press press the front film and back film, and move together with the solar cell unit; and performing a melting-solidification operation while keeping the first press and second press pressing against the front film. A press assembly and a device are also provided to perform the method.

6 Claims, 16 Drawing Sheets

(56) References Cited

U.S. PATENT DOCUMENTS

| | | | |
|---|---|---|---|
| 2013/0112234 A1* | 5/2013 | Ishii | H01L 31/048 |
| | | | 136/244 |
| 2015/0349703 A1* | 12/2015 | Morad | H01L 31/049 |
| | | | 136/251 |
| 2017/0077343 A1* | 3/2017 | Morad | H01L 31/0747 |
| 2017/0162736 A1* | 6/2017 | Sethi | H01L 31/0512 |
| 2017/0213929 A1* | 7/2017 | Lance | H02S 40/36 |
| 2018/0033902 A1* | 2/2018 | Caswell | H01L 31/035281 |
| 2018/0175233 A1* | 6/2018 | Reddy | H01L 31/028 |
| 2021/0082634 A1* | 3/2021 | Lee | H01L 31/022466 |
| 2021/0098641 A1* | 4/2021 | Sewell | H01L 31/18 |
| 2021/0202784 A1* | 7/2021 | Galiazzo | H01L 31/188 |
| 2022/0285572 A1* | 9/2022 | Huang | H01L 31/0504 |
| 2022/0406951 A1* | 12/2022 | Chen | H01L 31/188 |
| 2023/0006089 A1* | 1/2023 | Li | H01L 31/186 |
| 2023/0271279 A1* | 8/2023 | Yang | B65G 21/2036 |
| | | | 228/244 |
| 2023/0282762 A1* | 9/2023 | Chen | B23K 1/0008 |
| | | | 438/61 |
| 2023/0327046 A1* | 10/2023 | Chen | H01L 31/1804 |
| | | | 136/252 |
| 2023/0361233 A1* | 11/2023 | Chen | H01L 31/1876 |

\* cited by examiner

METHOD AND DEVICE FOR FIXED CONNECTION OF SOLAR CELL STRING, AND PRESS ASSEMBLY

CROSS-REFERENCE TO RELATED APPLICATIONS

This application claims the benefit of priority from Chinese Patent Application No. 202211224117.9, filed on Oct. 9, 2022. The content of the aforementioned application, including any intervening amendments thereto, is incorporated herein by reference in its entirety.

TECHNICAL FIELD

The present disclosure relates to photovoltaic cell production, and more particularly to a method and device for fixed connection of a solar cell string, and a press assembly.

BACKGROUND

At present, the bonding between the solder ribbon and the solar cell is usually performed by using an insulating film. Specifically, the solder ribbon is covered on the surface of the solar cell to be in contact with the grid of the solar cell. The insulating film is bonded onto the surface of the solar cell to fix the solder ribbon, then multiple solar cells are connected in series to form a solar cell string, and finally, multiple strings are stacked to form a solar cell module. This method has been widely used in the manufacturing of solar cell modules due to low loss of the silver paste at the grid and large conversion efficiency of the solar cell. Two sides of the solar cell string are respective positive and negative electrodes. Regarding adjacent solar cells, a side of one is connected to a side of the other through the solder ribbon (e.g., metal wire), and in this manner, multiple solar cells are connected in series.

In the prior art, the insulating film is bonded onto the surface of the solar cell mainly by hot pressing. During the thermal bonding process, it is necessary to apply pressure and heat to the insulating film and solar cell to allow the full contact therebetween, enabling the complete bonding of the insulating film to the surface of the solar cell. In order to avoid the shrinkage of the insulating film during the thermal bonding, the pressure release should be performed after the insulating film and the solar cell are completely cooled.

Unfortunately, regarding the hot-pressing method mentioned above, the melting and cooling-solidification operations of the insulating film are time-consuming, leading to a production efficiency of solar cell strings.

SUMMARY

In order to overcome the above-described problem, the present disclosure provides a method and device for fixed connection of a solar cell string, and a press assembly.

The technical solutions of the present disclosure are described as follows.

In a first aspect, the disclosure provides a method for fixed connection of a solar cell string, comprising:
  laying the solar cell string; and
  performing a melting-solidification operation;
  wherein the laying of the solar cell string comprises:
    stacking a back film, a first solder ribbon, a solar cell, a second solder ribbon and a front film to form a solar cell unit; wherein the first solder ribbon comprise a first solder ribbon section and a second solder ribbon section connected with each other; the second solder ribbon comprises a third solder ribbon section and a fourth solder ribbon section connected with each other;
  wherein the stacking comprises:
    laying the second solder ribbon section on the back film;
    laying the solar cell on the second solder ribbon section;
    laying the third solder ribbon section on the solar cell; and
    laying the front film on the third solder ribbon section to form the solar cell unit;
  connecting N solar cell units in series to form the solar cell string, wherein N is an integer equal to or greater than 2; and
  placing a first press on the front film to form a laying unit, and placing a second press on the front film of the laying unit, wherein the first press presses against at least a middle portion of the front film; and the second press presses against at least a head portion of the front film; and the head portion is an end of the front film covering the third solder section; and
  the melting-solidification operation is performed through steps of:
    after the first press is placed on the front film, subjecting the laying unit to melting and solidification; placing the second press on the laying unit; transferring the laying unit with the second press to a melting-solidification zone for melting and solidification to complete fixed connection of the solar cell string; and removing the first press and the second press from the front film of the solar cell string; or
    after the first press and the second press are both placed on the front film of the laying unit; transferring the laying unit with the second press to the melting-solidification zone for melting and solidification to complete fixed connection of the solar cell string; and removing the first press and the second press from the front film of the solar cell string.

In some embodiments, the second press is placed through steps of:
  after placing the first press, conveying the laying unit in a direction close to the melting-solidification zone, and placing the second press on the laying unit;
  laying another solar cell unit at an end of the laying unit away from the head end of the front film, and connecting two solar cell units in series to form the solar cell string; and
  successively placing another first press and another second press on the another solar cell unit.

In some embodiments, the first press presses against the middle portion and a tail portion of the front film, and the second press presses against the head portion of the front film; or
  the first press presses against the middle portion of the front film, and the second press presses against the head portion and the tail portion of the front film; or
  the first press presses against the middle portion of the front film, and the second press presses against the head portion of the front film and a tail portion of a previous front film;
  wherein the head portion and the tail portion of the same front film are symmetrical with respect to the middle portion.

In some embodiments, the laying of the solar cell string comprises:
  laying another solar cell on the fourth solder ribbon section on a next back film while placing the first press and the front film on the third solder ribbon section to form the laying unit;

conveying the laying unit in a direction close to the melting-solidification zone, and placing the second press on the laying unit;

conveying the solar cell unit with the first press and the second press to the melting-solidification zone for melting and solidification until the front film and the back film are solidified; and removing the first press and the second press from the front film of the solar cell unit.

In some embodiments, when the first press and the front film are placed on the third solder ribbon section, the head portion of the front film is curled in a direction away from the solar cell.

In some embodiments, in the melting-solidification operation, the solar cell unit is heated and cooled integrally; and the melting-solidification zone comprises a heating subzone and a cooling subzone; and the solar cell unit with the first press and the second press successively passes through the heating subzone and the cooling subzone to allow melting and solidification of the front film and back film.

In some embodiments, after the first press is placed, the solar cell unit is successively heated and cooled, such that the middle portion of the front film and a portion of the back film corresponding to the middle portion of the front film are solidified.

In a second aspect, the disclosure provides a press assembly for implementing the above-mentioned method, comprising:

the first press; and
the second press;
wherein the head portion of the front film corresponds to a portion of the third solder ribbon section away from the fourth solder ribbon section; a tail portion of the front film corresponds to a portion of the third solder ribbon section close to the fourth solder ribbon section; the middle portion of the front film is between the head portion of the front film and the tail portion of the front film; the first press is configured to press against at least the middle portion of the front film; and the second press is configured to press against at least the head portion of the front film.

In some embodiments, the first press is configured to press against the middle portion and the tail portion of the front film; and the second press is configured to press against the head portion of the front film.

In some embodiments, the first press is configured to press against the middle portion of the front film; and the second press is configured to press against the head portion and the tail portion of the front film; or the second press is configured to press against the head portion of the front film and a tail portion of a previous front film.

In some embodiments, the second press is sleevedly arranged on an outer side of the first press; two opposite sides of the second press are respectively provided with a pressing part; and two pressing parts are configured to press against the head portion and the tail portion of the front film of the same solar cell unit.

In a third aspect, the disclosure provides a device for implementing the above-mentioned method, comprising:

a ribbon supply mechanism;
a first conveying assembly;
a stacking part;
a first mechanical arm; and
a second mechanical arm;
wherein the ribbon supply mechanism is configured to supply the first solder ribbon and the second solder ribbon;

the first conveying assembly is configured to convey the solar cell string;

the stacking device is configured to supply the solar cell, the front film and the first press;

the first mechanical arm is configured to retrieve the first press from the laying unit after a melting-solidification operation is completed;

the second mechanical arm is configured to place the second press onto the front film, and retrieve the second press from the laying unit after the melting-solidification operation is completed; and the ribbon supply mechanism is arranged at a starting end of the first conveying assembly; the stacking part is arranged close to the starting end of the first conveying assembly; and the first mechanical arm and the second mechanical arm are arranged corresponding to the first conveying assembly, and are capable of reciprocating along a conveying direction of the first conveying assembly.

In some embodiments, the first conveying assembly comprises a driving mechanism, a conveyor belt and a heating mechanism; the driving mechanism is configured to drive the conveyor belt; the heating mechanism is arranged at a conveying path of the conveyor belt; and the heating mechanism is configured to heat the solar cell unit pressed by the first press and the second press.

In some embodiments, the device further comprises:
a second conveying assembly;
wherein the second conveying assembly is configured to carry and transport the first press, the second press, or a combination thereof from a terminal end of the first conveying assembly to the starting end of the first conveying assembly; and a conveying direction of the second conveying assembly is opposite to the conveying direction of the first conveying assembly.

In some embodiments, the second conveying assembly comprises a first conveying platform and a second conveying platform; the first conveying platform is configured to convey the first press; the second conveying platform is configured to convey the second press; and the first conveying platform and the second conveying platform are arranged in parallel and spaced apart;

the stacking part is configured to place the first press from the first conveying platform onto the front film of the solar cell unit; and the second mechanical arm is configured to place the second press from the second conveying platform onto the front film of the solar cell unit.

In some embodiments, the first mechanical arm comprises a first driving unit, a second driving unit, a third driving unit and a first clamping part; and the second mechanical arm comprises a fourth driving unit, a fifth driving unit and a second clamping part;

the first driving unit is configured to drive the first clamping part to move along a first preset direction; and the fourth driving unit is configured to drive the second clamping part to move along the first preset direction;

the second driving unit is configured to drive the first clamping part to move along a second preset direction;

the third driving unit is configured to drive the first clamping part to move along a third preset direction; and the fifth driving unit is configured to drive the second clamping part to move along the third preset direction;

the first preset direction is the same as the conveying direction of the first conveying assembly; the second preset direction is perpendicular to the first preset direction; and the third preset direction is perpendicular to a plane determined by the first preset direction and the second preset direction;

the first mechanical arm is configured to retrieve the first press from the laying unit after the melting-solidification operation is completed, and place the first press on the second conveying assembly;

the second conveying assembly is configured to carry and convey the first press; and the second mechanical arm is configured to retrieve the second press from the laying unit after the melting-solidification operation is completed, and place the second press on a front film of another laying unit at the starting end of the first conveying assembly.

In some embodiments, the second conveying assembly is configured to carry and convey the second press;

the second mechanical arm comprises a first gripping part and a second gripping part; the first gripping part is arranged at a head end of the second conveying assembly; and the second gripping part is arranged at a tail end of the second conveying assembly;

the first gripping part is arranged close to the starting end of the first conveying assembly; and the first gripping part is configured to place the second press from the second conveying assembly onto a front film of another laying unit at the starting end of the first conveying assembly;

the second gripping part is arranged close to the terminal end of the first conveying assembly; and the second gripping part is configured to place the second press from the terminal end of the first conveying assembly onto the second conveying assembly;

a bearing platform is arranged close to the stacking part, and is configured to bear the first press; and the first mechanical arm is configured to retrieve the first press from the terminal end of the first conveying assembly, and place the first press on the bearing platform.

In some embodiments, the second conveying assembly is configured to carry and convey the first press and the second press;

the second mechanical arm comprises a first gripping part and a second gripping part; the first gripping part is arranged at a head end of the second conveying assembly; and the second gripping part is arranged at a tail end of the second conveying assembly;

the first gripping part is arranged close to the starting end of the first conveying assembly; and the first gripping part is configured to place the second press from the second conveying assembly onto a front film of another laying unit at the starting end of the first conveying assembly;

the second gripping part is arranged close to the terminal end of the first conveying assembly; and the second gripping part is configured to place the first press and the second press from the terminal end of the first conveying assembly onto the second conveying assembly;

a bearing platform is arranged close to the stacking part, and is configured to bear the first press; and the first mechanical arm is configured to retrieve the first press from the second conveying assembly, and place the first press on the bearing platform.

Compared to the prior art, this application has the following beneficial effects.

Regarding the method provided herein for fixed connection of the solar cell string, a first press and a second press are placed on a front film to apply pressure to the front film and back film to keep the front film and the back film flat, which effectively avoids the shrinkage of the front film and the back film during the melting-solidification operation. The first press and the second press press against the front film prior to the melting-solidification operation, such that the first press and the second press can move with the solar cell string, and can always press the front film throughout the melting-solidification operation. Therefore, the solar cell string can move in the melting-solidification zone constantly without stay, which improves the production efficiency of the solar cell string.

Since the press assembly and the device provided herein are configured for implementing the method mentioned above, they can also arrive at the above-mentioned beneficial effects.

Other advantages of the present disclosure will be described below, and will be partly apparent from the following description or understood based on the embodiments of the present disclosure.

BRIEF DESCRIPTION OF THE DRAWINGS

The disclosure will be described completely and clearly below with reference to the accompanying drawings and embodiments to make the object, technical solutions, and beneficial effects of the present disclosure clearer. Obviously, presented in the accompany drawings are merely some embodiments of the present disclosure, which are not intended to limit the disclosure.

Figure 1:
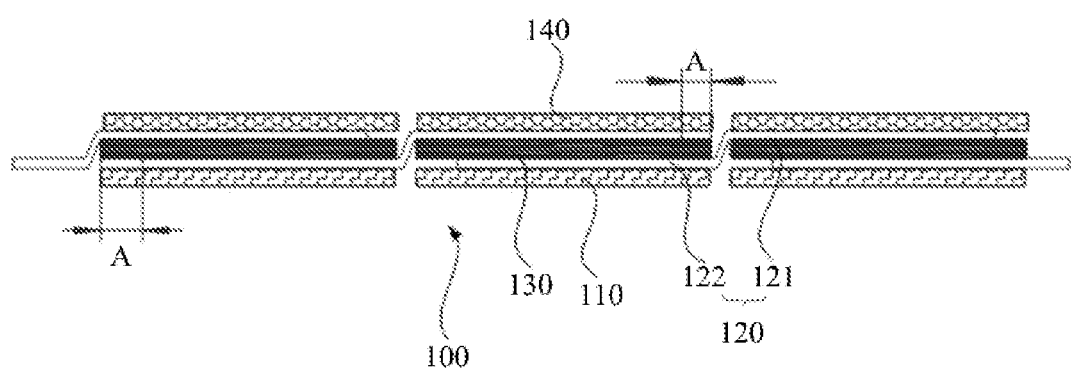
FIG. 1 structurally depicts a device for producing a solar cell string according to an embodiment of the disclosure.

In the drawings: 100, solar cell string; 110, back film; 120, solder ribbon; 121, first solder ribbon section; 122, second solder ribbon section; 130, solar cell; 140, front film; 141, head portion; 142, middle portion; 143, tail portion; 150, solar cell unit; 160, laying unit; 170, melting-solidification zone; 200, press assembly; 210, first press; 220, second press; 221, pressing part; 300, device; 310, ribbon supply mechanism; 320, first conveying assembly; 321, heating mechanism; 330, stacking part; 331, bearing platform; 340, first mechanical arm; 341, first driving unit; 342, second driving unit; 343, third driving unit; 344, clamping part; 3441, first adjustment plate; 3442, second adjustment plate; 3443, first driving part; 3444, second driving part; 345, third driving part; 3451, sliding rod; 346, first gripping part; 347, second gripping part; 348, third gripping part; 349, fourth gripping part; 350, second mechanical arm; 360, second conveying assembly; 361, first conveying platform; and 362, second conveying platform.

DETAILED DESCRIPTION OF EMBODIMENTS

The disclosure will be described completely and clearly below with reference to the accompanying drawings and embodiments to make the object, technical solutions, and beneficial effects of the present disclosure clearer. Obviously, provided below are merely some embodiments of the disclosure, which are not intended to limit the disclosure. The components described and illustrated in the drawings can be arranged and designed in various configurations.

Therefore, the embodiments provided in the accompanying drawings are merely illustrative, and are not intended to limit the scope of the present disclosure. Based on the embodiments of the present disclosure, all other embodiments obtained by those skilled in the art without paying any creative effort shall fall within the scope of the present disclosure.

The features of various embodiments may be combined on the premise of no contradiction.

It should be noted that similar reference numerals or letters indicate similar elements in the following drawings. Therefore, once a certain element is defined in one drawing, it does not need to be further defined and explained in subsequent drawings.

It should be understood that the orientational or positional relationship indicated by the terms is based on the orientational or positional relationship shown in the drawings, or as commonly placed when the product of this application is used, or as commonly understood by those skilled in the art. These terms are only intended to simplify the description of the disclosure, rather than indicating and implying that the device or element referred to must have a particular orientation or be constructed and operated in a particular orientation, and therefore cannot be construed as a limitation of the disclosure.

In addition, it should be noted that, terms "first", "second", etc. are used only for distinguishment, and should not be understood as indicating or implying relative importance.

Unless otherwise specified, terms "arrange", "mount", "connect" and so on should be understood in a broad sense, such as fixed connection, removable connection, or integral connection; direct connection, or indirect connection through an intermediate medium.

At present, the bonding between the solder ribbon and the solar cell is usually performed by using an insulating film. Specifically, the solder ribbon is covered on the surface of the solar cell to be in contact with the grid of the solar cell. The insulating film is bonded onto the surface of the solar cell to fix the solder ribbon, then multiple solar cells are connected in series to form a solar cell string, and finally, multiple strings are stacked to form a solar cell module. This method has been widely used in the manufacturing of solar cell modules due to low loss of the silver paste at the grid and large conversion efficiency of the solar cell. Two sides of the solar cell string are respective positive and negative electrodes. Regarding adjacent solar cells, a side of one is connected to a side of the other through the solder ribbon (e.g., metal wire), and in this manner, multiple solar cells are connected in series.

In the prior art, the insulating film is bonded onto the surface of the solar cell mainly by hot pressing. During the thermal bonding process, it is necessary to apply pressure and heat to the insulating film and solar cell to allow the full contact therebetween, enabling the complete bonding of the insulating film to the surface of the solar cell. In order to avoid the shrinkage of the insulating film during the thermal bonding, the pressure release should be performed after the insulating film and the solar cell are completely cooled.

Unfortunately, regarding the hot-pressing method mentioned above, the melting and cooling-solidification operations of the insulating film are time-consuming, leading to a production efficiency of solar cell strings.

Accordingly, this application provides a method for fixed connection of a solar cell string. Regarding the method, a first press and a second press are placed on a front film to apply pressure to the front film and back film to keep the front film and the back film flat, which effectively avoids the shrinkage of the front film and the back film during the melting-solidification operation. The first press and the second press press against the front film prior to the solidification, such that the first press and the second press can move with the solar cell string, and can always press the front film throughout the melting-solidification operation. Therefore, the solar cell string can move in the melting-solidification zone constantly without stay, which improves the production efficiency of the solar cell string.

Figure 2:
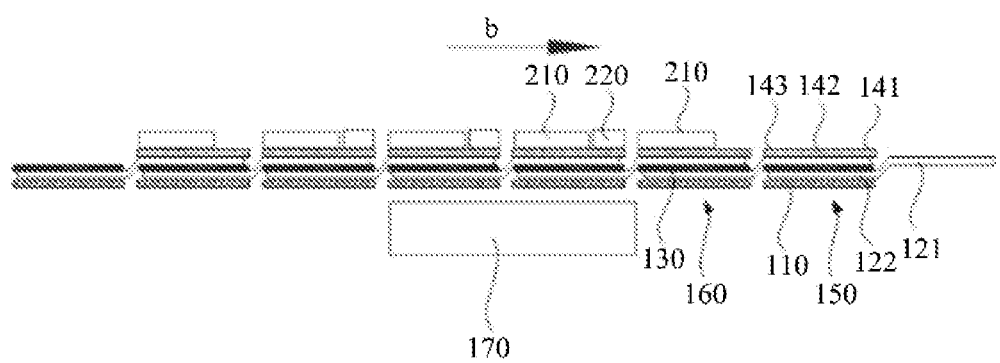
FIG. 2 schematically depicts a first arrangement scheme of a press assembly according to an embodiment of the disclosure.

Referring to FIGS. 1 and 2, the method for fixed connection of a solar cell string 100 includes the following steps:

The solar cell string is laid. A melting-solidification operation is performed.

The laying of the solar cell string includes the following steps.

A back film 110, a first solder ribbon 120, a solar cell 130, a second solder ribbon 120 and a front film 140 are stacked to form a solar cell unit 150. The first solder ribbon 120 includes a first solder ribbon 121 and a second solder ribbon 122 connected with each other. The second solder ribbon includes a third solder ribbon section and a fourth solder ribbon section connected with each other.

The stacking includes the following steps.

The second solder ribbon section 122 is laid on the back film 110. The solar cell 130 is laid on the second solder ribbon 122. The third solder ribbon section is laid on the solar cell 130. The front film 140 is laid on the third solder ribbon section to form the solar cell unit 150.

N solar cell units 150 are connected in series to form the solar cell string 100. N is an integer equal to or greater than 2.

A first press 210 is placed on the front film 140 to form a laying unit 160. A second press 220 is placed on the front film 140 of the laying unit 160. The first press 210 presses against at least a middle portion 142 of the front film.

The second press 220 presses against at least a head portion 141 of the front film. The head portion 141 is an end of the front film covering the third solder section.

The melting-solidification operation is performed through the following steps.

After the first press 210 is placed on the front film 140, the laying unit 160 is subjected to solidification. The second press 220 is then placed on the laying unit 160. The laying unit 160 is transmitted with the second press 220 to a melting-solidification zone 170 for solidification to complete fixed connection of the solar cell string 100. The first press 210 and the second press 220 are removed from the front film 140 of the solar cell string 100.

Alternatively, after the first press 210 and the second press 220 are both placed on the front film 140 of the laying unit, the laying unit 160 is transmitted with the second press 220 to the melting-solidification zone 170 for solidification to complete fixed connection of the solar cell string 100. The first press 210 and the second press 220 are removed from the front film 140 of the solar cell string 100.

It should be noted that, the first press 210 and the second press 220 are placed on a front film to apply pressure to the front film 140 and back film 110 to keep the front film and the back film flat, which effectively avoids the shrinkage of the front film 140 and the back film 110 during the melting-solidification operation. The first press 210 and the second press 220 press against the front film 140 prior to the solidification, such that the first press 210 and the second press 220 can move with the solar cell string 100, and can always press the front film throughout the melting-solidification operation. Therefore, the solar cell string can move in the melting-solidification zone 170 constantly without stay, which improves the production efficiency of the solar cell string 100.

In order to avoid the short-circuit of the solar cell string 100 due to overlapping of an end of a solder ribbon 120 and an adjacent solar cell 130, the first solder ribbon 121 and the second solder ribbon 122 in the solar cell unit 130 extend along the solar cell 130 but do not extend out of edges of the solar cell 130. Generally, there is a 2-10 mm spacing between each end of the solder ribbon 120 and the corresponding edge of the solar cell 130, indicated as A in FIG. 1. An edge of the front film 140 and an edge of the back film 110 coincide with or are close to the edges of the edges of the solar cell 130 or the solder ribbons.

A moving direction of the solar cell string 100 is indicated as b in FIG. 2, along which the solar cell string 100 is laid.

A first arrangement mode of the press assembly 200 is shown in FIG. 2. The press assembly 200 includes a first press 210 and a second press 220. A size of the first press 210 is larger than a size of the second press 220. The first press 210 is configured to press against a middle portion 142 and a tail portion 143 of front film. The second press 220 is configured to press against a head portion 141 of front film.

The melting-solidification zone 170 includes a heating subzone and a cooling subzone, or only includes the heating subzone. The cooling subzone is arranged in an extension line of a line provided with the heating subzone. The cooling subzone can be a space with no cooling device. Therefore, when the solar cell string 100 after heating passes through the cooling subzone, the front film 140 and the back film 110 are firmly stuck.

In an embodiment, the second press 220 is placed on the front film 140 of the laying unit 160 through the following steps. After the first press 210 is placed, the laying unit 160 is conveyed close to the melting-solidification zone 170. The second press 220 is placed on the laying unit 160, meanwhile, the laying process is continued at an end of the laying unit 160 away from the head portion 141 to form another solar cell unit 150. The solar cell units 160 are connected in series form the solar cell string 100. Another first press 210 and another second press 220 are successively placed on another solar cell unit 150, so as to form a continuous laying unit 160.

It should be noted that, in the moving direction of the solar cell string 100, the laying process and the melting-solidification operation are performed simultaneously. When placing the second press 220 on the front solar cell unit 150, an adjacent solar cell unit is undergoing the laying process and the melting-solidification operation, such that the laying process and the melting-solidification operation of the solar cell string 100 are continuous, improving a production efficiency.

In an embodiment, in the laying process of the solar cell string 100, the first press 210 presses against at least the middle portion 142, and the second press 220 presses against at least the head portion 141.

Specifically, the first press 210 presses against the middle portion 142 and the tail portion 143, and the second press 220 presses against the head portion 141; or the first press 210 presses against the middle portion 142, and the second press 220 presses against the head portion 141 and the tail portion 143; or the first press 210 presses against the middle portion 142, and the second press 220 presses against the head portion 141 and a tail portion 143 of a previous adjacent front film.

The head portion 141 and the tail portion 143 of the same front film are symmetrical with respect to the middle portion 142 of this front film.

There are three arrangement modes of the first press 210 and the second press 220.

Referring to FIG. 2, the first press 210 presses against the middle portion 142 and the tail portion 143, and the second press 220 presses against the head portion 141. In the embodiment, the size of the first press 210 is larger than the size of the second press 220.

Figure 3:
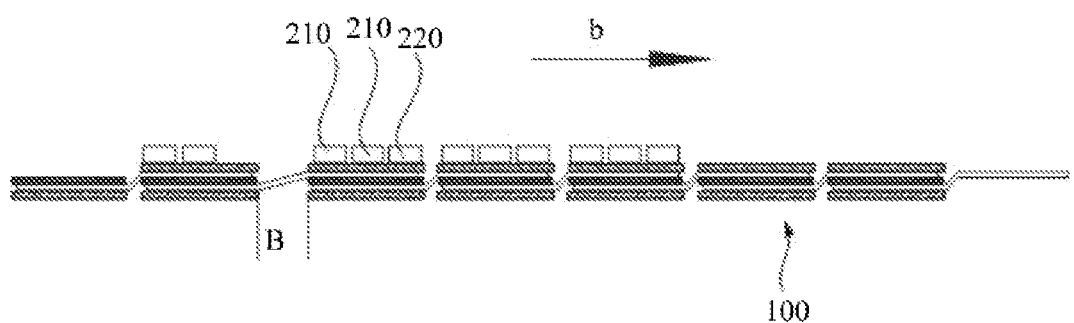
FIG. 3 schematically depicts a second arrangement scheme of the press assembly according to an embodiment of the disclosure.

Referring to FIG. 3, the size of the first press 210 is same to the size of the second press 220. Two first presses 210 are placed at the middle portion 142 and the tail portion 143, respectively. The second press 220 is placed at the head portion 141.

It should be noted that B in FIG. 3 represents a distance between two adjacent solar cell string 100, named as solar cell string distance. The solar cell string distance is larger than a distance between two adjacent solar cells 130. The solder ribbons of each solar cell string 100 extend out of the solar cells 130. Since the the laying process of the solar cell string 100 is continuous, an extended section of the solder ribbon between two adjacent solar cell strings 100 will be prolonged, which increases the distance between two adjacent solar cell strings 100. In the subsequent process, the extended section of the solder ribbon between two adjacent solar cell strings 100 will be cut off to manufacture a single solar cell string 100.

Figure 4:
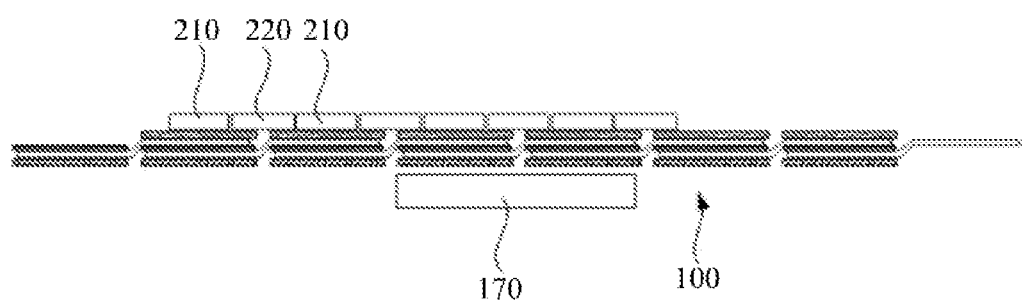
FIG. 4 schematically depicts a third arrangement scheme of the press assembly according to an embodiment of the disclosure.

Referring to FIG. 4, the first press 210 presses against the middle portion 142, the second press 220 presses against the head portion 141 and a tail portion 143 of an adjacent front film. Specifically, the press assembly includes one first press 210 and one second press 220. The size of the first press 210 is same to the size of the second press 220. The first press 210 presses against the middle portion 142, the second press 220 covers a gap between two adjacent solar cell units 150, and presses against the head portion 141 and the tail portion 143 of the adjacent front film.

Figure 5:
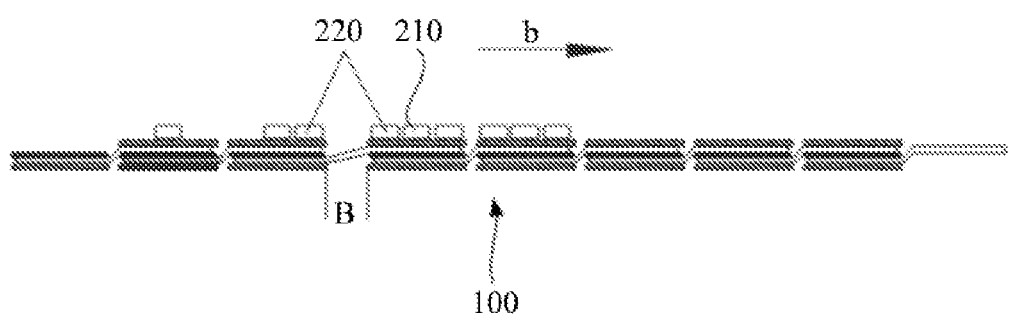
FIG. 5 schematically depicts a fourth arrangement scheme of the press assembly according to an embodiment of the disclosure.

Referring to FIG. 5, one first press 210 is placed at the middle portion 142. One second presses 220 is placed at the head portion 141, and another second presses 220 is placed at the tail portion 143. The size of the first press 210 is same to the size of the second press 220.

Figure 6:
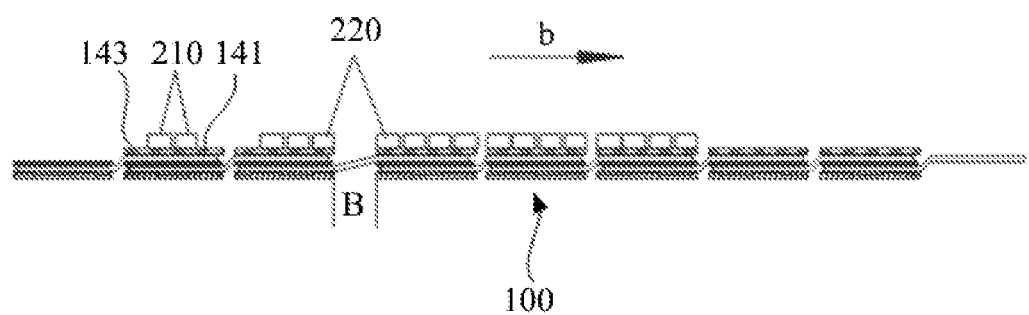
FIG. 6 schematically depicts a fifth arrangement scheme of the press assembly according to an embodiment of the disclosure.

Referring to FIG. 6, two first presses 210 are placed at the middle portion 142 with a gap. One second press 220 is placed at the head portion 141, and another second press 220 is placed at the tail portion 143. The size of the first press 210 is same to the size of the second press 220.

Figure 7:
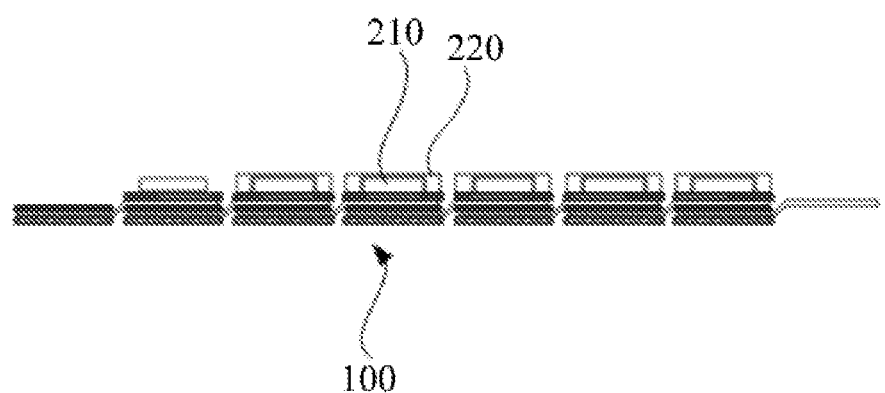
FIG. 7 schematically depicts a sixth arrangement scheme of the press assembly according to an embodiment of the disclosure.

Referring to FIG. 7, the first press 210 presses against the middle portion 142. The second press 220 presses against the head portion 141 and the tail portion 143.

In an embodiment, the laying process of the solar cell string 100 includes the following steps. During the first press 210 and the front film 140 are placed on the third solder ribbon section to form the laying unit 160, a solar cell 130 is laid on the second solder ribbon 122 of the second solder ribbon laid on a next adjacent back film 110, in which the second solder ribbon 122 laid on the next adjacent back film 130 is connected to the third solder ribbon section laid on the solar cell 130. The laying unit 160 is transmitted close to the melting-solidification zone 170, and the second press 220 is placed on the laying unit 160. The solar cell unit 150 pressed by the first press 210 and the second press 220 is transmitted entirely into the melting-solidification zone 170 for solidification until the front film 140 and the back film 110 are solidified. Then the first press 210 and the second press 220 are remove from the front film 140 of the solar cell unit 150.

Since the first press 210 and the front film 140 are placed at the first solder ribbon 121, the first press 210 and the front film 140 can be clamped together. The first press 210 is placed at a back portion of the front film 140, and then placed on the first solder ribbon 121, developing a laying efficiency of the solar cell string 100.

The laying unit 160 is conveyed close to the melting-solidification zone 170, and then the second press 220 is placed on the laying unit 160, that is, the laying of the first press 210 and the laying of the second press 220 occur at different position. Accordingly, a mechanical arm for laying the first press 210 and a mechanical arm for laying the second press 220 are prevent from interference, the laying of the first press 210 and the laying of the second press 220 are stable and reliable, and the laying efficiency of the solar cell string 100 is improved.

Since the solar cell unit 150 pressed by the first press 210 and the second press 220 is entirely transmitted into the melting-solidification zone 170 for solidification, the melting-solidification zone 170 can integrally arranged, which facilitates the installation the device and solidification of the solar cell unit 150.

In an embodiment, according to a requirement, when laying the first press 210, the solar cell unit 150 pressed by the first press 210 can undergo a partial solidification, and then the solar cell unit 150 pressed by the first press 210 and the second press 220 is integrally solidified.

In an embodiment, when the first press 210 and the front film 140 are placed on the third solder ribbon section, the head portion 141 is curled in a direction away from the solar cell 130.

In an embodiment, in the melting-solidification operation, the entire solar cell unit 150 is heated and cooled integrally. Specifically, the melting-solidification zone 170 includes a heating subzone and a cooling subzone. The solar cell unit 150 pressed by the first press 210 and the second press 220 successively passes through the heating subzone and the cooling subzone to allow melting and solidification of the front film 140 and back film 110.

The solar cell unit 150 can complete the heating for bonding and the cooling process after heating by passing through the melting-solidification zone 170, ensuring a stability of solidification of the solar cell unit 150.

In an embodiment, when the first press 210 is placed, and the solar cell unit 150 is solidified meanwhile. Specifically, after the first press 210 is placed, the solar cell unit 150 is successively heated and cooled, such that the middle portion 142 and a corresponding back film 110 are solidified completely.

It should be noted that upon the first press 210 is placed, a part of the solar cell unit 150 pressed by the first press 210 is immediately heated and cooled to perform the partial solidification, which enhances the stability of the solar cell unit 150 during conveying.

This application also provides a press assembly 200 for implementing the above-mentioned method. The press assembly 200 includes the first press 210 and the second press 220. The head portion 141 of the front film 140 corresponds to a portion of the third solder ribbon section away from the fourth solder ribbon section. The tail portion 143 of the front film 140 corresponds to a portion of the third solder ribbon section close to the fourth solder ribbon section. The middle portion 142 is between the head portion 141 and the tail portion 143. The first press 210 is configured to press against at least the middle portion 142. The second press 220 is configured to press against at least the head portion 141.

It should be noted that the first press 210 and the second press 220 are placed at different positions on the front film 140, and are placed at different time.

The first press 210 can press against other portions of the front film 140 in addition to the middle portion 142. The second press 220 can press against other portions of the front film 140 in addition to the head portion 141.

In an embodiment, the first press 210 is configured to press against the middle portion 142. The second press 220 is configured to press against the head portion 141 and the tail portion 143. Alternately, the second press 220 is configured to press against the head portion 141 and a tail portion 143 of an adjacent front film.

It should be noted that there are various forms of the first press 210 and the second press 220, so does the placing position. When the first press 210 is configured to press against the middle portion 142, the number of the first press 210 can be one; or there are two first presses 210 arranged at the middle portion 142 with a gap.

Meanwhile, the second press 220 is configured to press against the head portion 141 and the tail portion 143 140. There may be two second presses 220 pressed by the same size. The two second presses 220 are placed at the head portion 141 and the tail portion 143 140, that is, two ends of the first press 210, respectively.

Alternatively, the second press 220 is configured to press against the head portion 141 and a tail portion 143 of an adjacent front film. That is, the second press 220 is placed at a tail portion of one solar cell unit 150 and a head portion of an adjacent solar cell unit 150.

Figure 8:
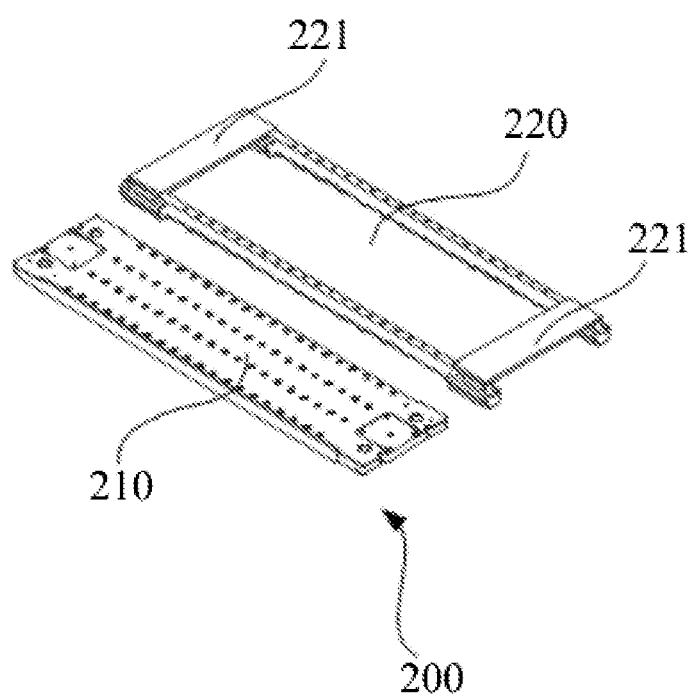
FIG. 8 is a structure diagram of a first press and a second press shown in FIG. 7.

Referring to FIGS. 7 and 8, the second press 220 is sleevedly arranged on an outer side of the first press 210. Two opposite sides of the second press 220 are respectively provided with a pressing part 221. The first press 210 is placed at the middle portion 142. The pressing parts 221 are configured to press against the head portion 141 and the tail portion 143 of the same solar cell unit.

Therefore, the second press 220 is integral, and capable of pressing the head portion 141 and the tail portion 143. It facilitates the placing and the removing of the second press 220.

Figure 9:
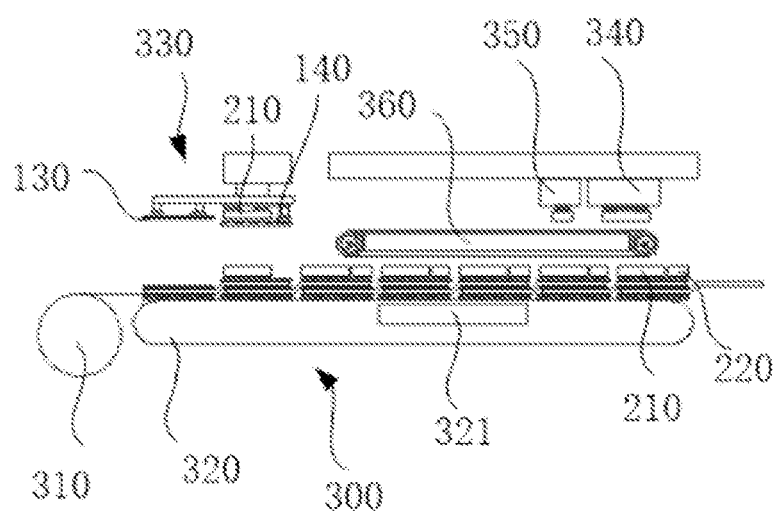
FIG. 9 is a structure diagram of a device for fixed connection of a solar cell string according to an embodiment of the disclosure.

Referring to FIG. 9, this application also provides a device 300 for implementing the above-mentioned method. The device 300 includes a ribbon supply mechanism 310, a first conveying assembly 320, a stacking part 330, a first mechanical arm 340 and a second mechanical arm 350. The ribbon supply mechanism 310 is configured to supply a solder ribbon. The first conveying assembly 320 is configured to convey the solar cell string 100. The stacking part 330 is configured to supply the solar cell 130, the front film 140 and the first press 210. The first mechanical arm 340 is configured to retrieve the first press 210 from the laying unit 160 after a melting-solidification operation is completed. The second mechanical arm 350 is configured to place the second press 220 onto the front film 140, and retrieve the second press 220 from the laying unit 160 after a melting-solidification operation is completed. The ribbon supply mechanism 310 is arranged at a starting end of the first conveying assembly 320. The stacking part 330 is arranged close to the starting end of the first conveying assembly 320. The first mechanical arm 340 and the second mechanical arm 350 are arranged corresponding to the first conveying assembly 320, and are capable of reciprocating along a conveying direction of the first conveying assembly 320.

During the laying and the solidification of the solar cell string 100, the first conveying assembly 320 is started, and the back film 100 is placed on the first conveying assembly 320. The first solder ribbon 120 is placed onto the back film 110 by the ribbon supply mechanism 310. The solar cell 130, the front film 140 and the first press 210 are successively placed on the first solder ribbon 120 by the stacking part, such that the laying unit 160 is completed. The second press 220 is placed on the laying unit 160 by the second mechanical arm 350, such that the middle portion 142, the head portion 141 and the tail portion 143 are abutted by the first press 210 and the second press 220. Through an operation of the first conveying assembly 320, the solar cell string 100 pressed by the first press 210 and the second press 220 is transmitted to pass through the melting-solidification zone 170 for solidification. After the solidification is complete, the first press 210 is removed by the first mechanical arm 340, and the second press 220 is removed by the second mechanical arm 350. The first press 210 and the second press 220 are placed on the front film 140 until completely solidified to press the front film 140 and the back film 110, and they can move with the solar cell string 100, therefore, the solar cell string can move in the melting-solidification zone constantly for solidification and does not need a standing time, which improves the production efficiency of the solar cell string.

In an embodiment, the first conveying assembly 320 includes a driving mechanism, a conveyor belt and a heating mechanism 321. The driving mechanism is configured to drive the conveyor belt. The heating mechanism 321 is arranged at a conveying path of the conveyor belt. The heating mechanism 321 is configured to heat the solar cell unit pressed by the first press 210 and the second press 220. The driving mechanism drives the conveyor belt to move, thereby realizing a conveying of the solar cell string 100 from laying to solidification, and a discharge after the solidification is completed, improving the production efficiency.

The heating mechanism 321 is a solidification mechanism, and is configured for the solidification of the back film 110 and the front film 140. The arrangement of the heating mechanism 321 allows the solar cell string 100 pressed by the first press 210 and the second press 220 being heated and solidified when passing through the heating mechanism 321, which does not need to stop for heating. Therefore, the conveying is continuous during heating, improving the production efficiency of the solar cell string 100.

In an embodiment, the device further includes a second conveying assembly 360. The second conveying assembly 360 is configured to carry and transport the first press, the second press, or a combination thereof from a terminal end of the first conveying assembly 320 to the starting end of the first conveying assembly 320. A conveying direction of the second conveying assembly 360 is opposite to the conveying direction of the first conveying assembly 320.

The second conveying assembly 360 is configured to remove the first press 210 or the second press 220 from the solar cell string 100 after solidification, and transport the solar cell string 100 to the starting end of the first conveying assembly 320, such that, before another solar cell string 100 undergoes solidification, the first press 210 and the second press 220 can be placed on another solar cell string 100. It reduces the number of the first press 210 and the second press 220, and the first press 210 and the second press 220 are fully used.

Figure 10:
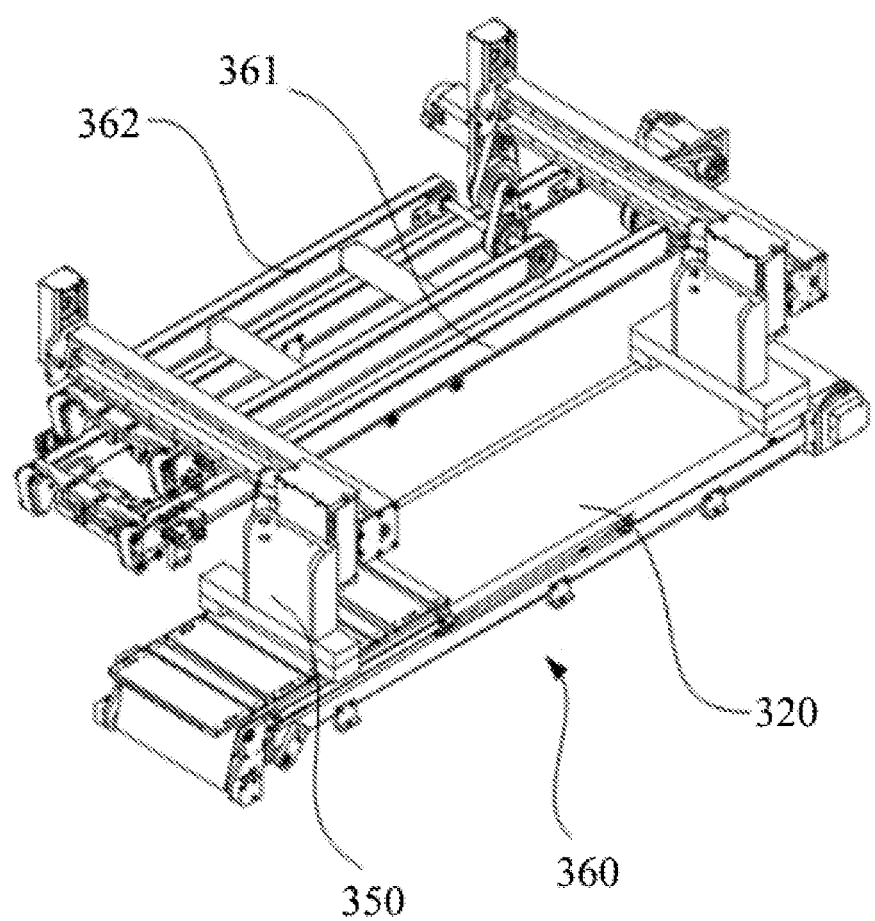
FIG. 10 schematically depicts the device according to an embodiment of the disclosure when adopting a first press arrangement scheme.

In an embodiment, referring to FIG. 10, the second conveying assembly 360 includes a first conveying platform 361 and a second conveying platform 362. The first conveying platform 361 is configured to convey the first press 210. The second conveying platform 362 is configured to convey the second press 220. The first conveying platform 361 and the second conveying platform 362 are arranged in parallel and spaced apart. The stacking part 330 is configured to place the first press 210 arranged on the first conveying platform 361 onto the front film 140 of the solar cell unit 150. The second mechanical arm 350 is configured to place the second press 220 arranged on the second conveying platform 362 onto the front film 140 of the solar cell unit 150.

Specifically, the first press 210 and the second press 220 are conveyed separately, facilitating the arrangement. In addition, the first press 210 and the second press 220 can be picked up conveniently when transmitting to the starting end of the first conveying assembly 320, which prevents a clamping part 344 from interference when the first press 210 and the second press 220 are picked up, ensuring the stability and order of the laying of the solar cell string 100.

Since the stacking part 330 is configured to place the first press 210, and the second mechanical arm 350 is configured to place the second press 220, the first press 210 and the second press 220 are easier to be laid on the solar cell unit 150.

It should be understood that the second mechanical arm 350 may be in various forms. In this embodiment, the second mechanical arm 350 is configured to place the second press 220 arranged on the second conveying platform 362 onto the front film 140 of the solar cell unit 150.

Figure 11:
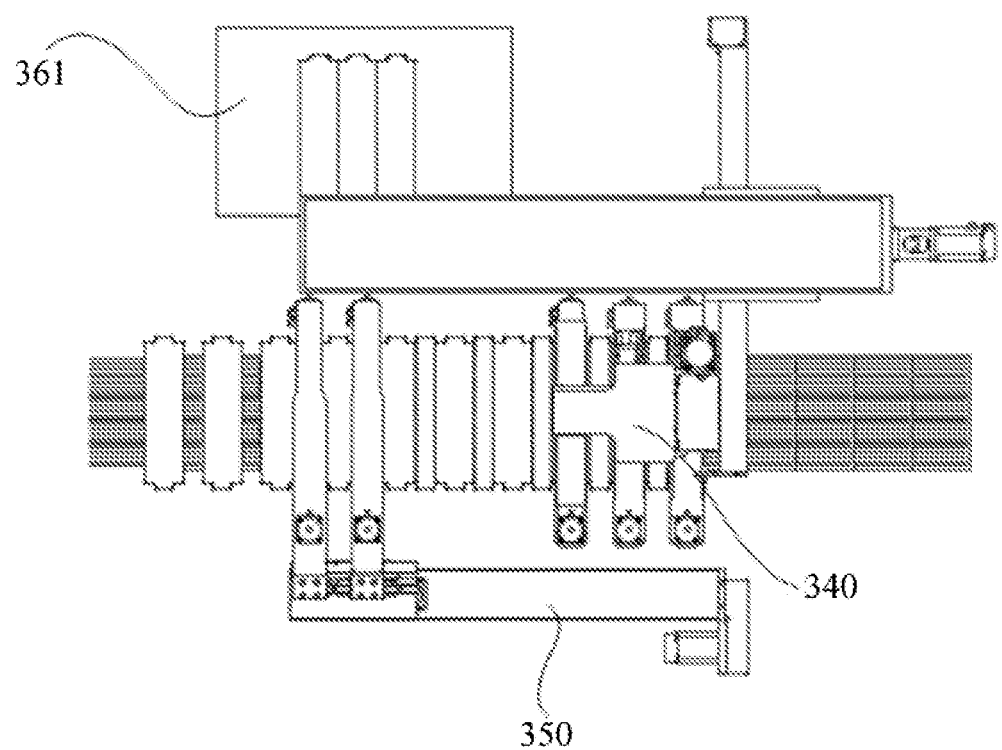
FIG. 11 schematically depicts the device according to an embodiment of the disclosure in a first view when adopting a second press arrangement scheme.
Figure 12:
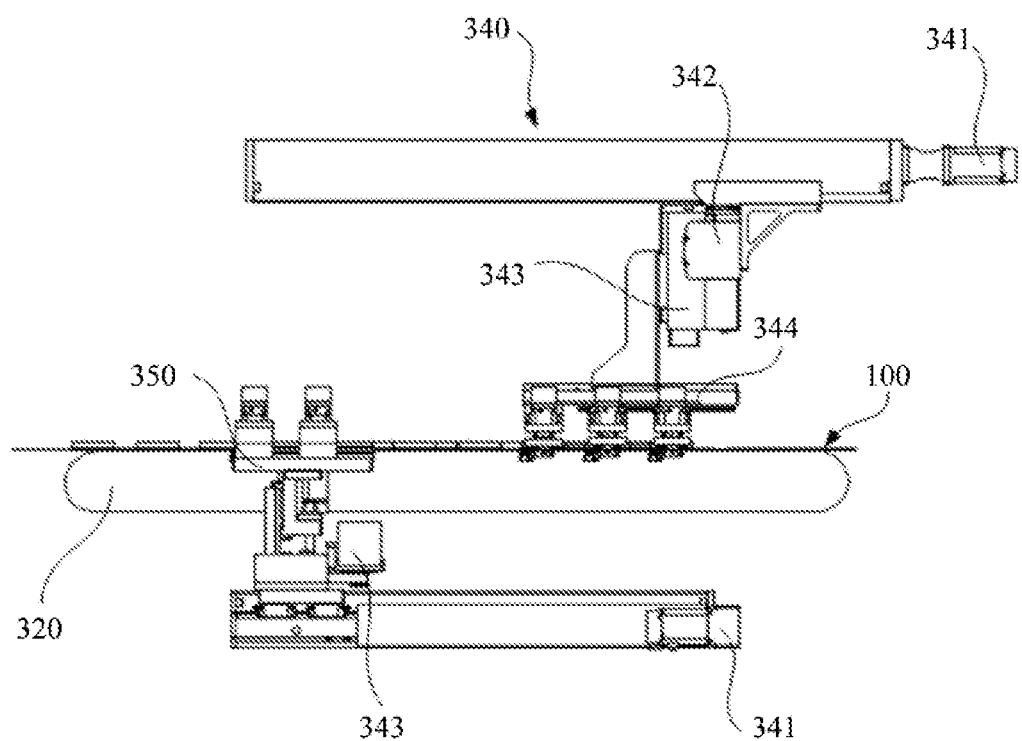
FIG. 12 schematically depicts the device according to an embodiment of the disclosure in a second view when adopting the second press arrangement scheme.

In an embodiment, referring to FIGS. 11 and 12, the first mechanical arm 340 includes a first driving unit 341, a second driving unit 342, a third driving unit 343 and a clamping part 344. The second mechanical arm 350 includes a first driving unit 341, a third driving unit 343 and a clamping part 344. The first driving units 341 of the first mechanical arm 340 and the second mechanical arm 350 are configured to drive the clamping part 344 to move along a first preset direction. The second driving unit 342 of the first mechanical arm 340 is configured to drive the clamping part 344 to move along a second preset direction. The third driving units 343 and the second mechanical arm 350 of the first mechanical arm 340 are configured to drive the clamping part 344 to move along a third preset direction. The first preset direction is same to the conveying direction of the first conveying assembly 320. The second preset direction is perpendicular to the first preset direction. The third preset direction is perpendicular to a plane determined by the first preset direction and the second preset direction. The first mechanical arm 340 is configured to retrieve the first press 210 from the laying unit 160 after the melting-solidification operation is completed, and place the first press 210 on the second conveying assembly 360. The second conveying assembly 360 is configured to carry and convey the first press 210. The second mechanical arm 350 is configured to retrieve the second press 220 from the laying unit 160 after the melting-solidification operation is completed, and place the second press 220 on a front film 140 of another laying unit 160 at the starting end of the first conveying assembly 320.

It should be noted that the first mechanical arm 340 has three operation directions, and the second mechanical arm 350 has two operation directions, so as to drive the first press 210 and the second press 220 to preset positions. That is, the first mechanical arm 340 can move front and back, left and right, and up and down due to the first driving unit 341, the second driving unit 342 and the third driving unit 343; and the second mechanical arm 350 can move front and back, and up and down due to the first driving unit 341 and the third driving unit 343.

After the solar cell string 100 is solidified, the first press 210 is retrieved and placed on the second conveying assembly 360 by the first mechanical arm 340, then the first press 210 is transmitted by the second conveying assembly 360 to the starting end of the first conveying assembly 320, facilitating being taken by the stacking part 330. Meanwhile, the second press 220 is retrieved and placed on a front film 140 of another solar cell string 100 at the starting end of the first conveying assembly 320.

Figure 13:
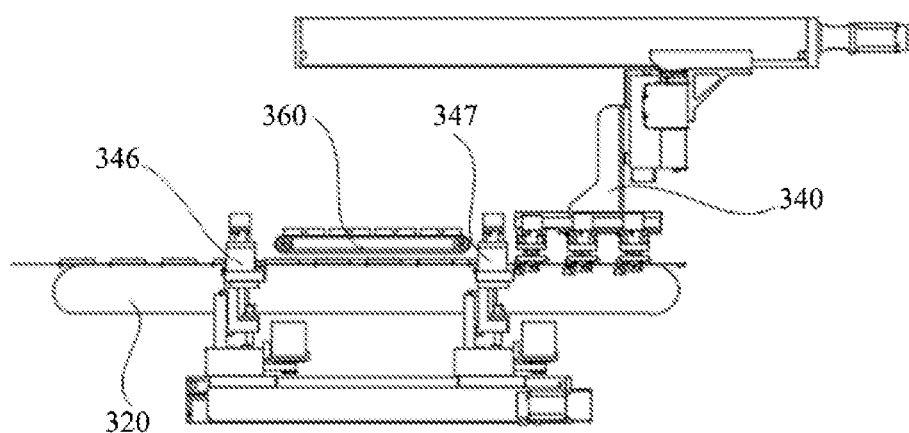
FIG. 13 schematically depicts the device according to an embodiment of the disclosure when adopting a third press arrangement scheme.

In an embodiment, referring to FIG. 13, the second conveying assembly 360 is configured to carry and convey the second press 220. The second mechanical arm 350 includes a first gripping part 346 and a second gripping part 347. The first gripping part 346 is arranged at a head end of the second conveying assembly 360. The second gripping part 347 is arranged at a tail end of the second conveying assembly 360. The first gripping part 346 is arranged close to the starting end of the first conveying assembly 320. The first gripping part 346 is configured to place the second press 220 from the second conveying assembly 360 onto the front film 140 of another laying unit 160 at the starting end of the first conveying assembly 320. The second gripping part 347 is arranged close to the terminal end of the first conveying assembly 320. The second gripping part 347 is configured to place the second press 220 from the terminal end of the first conveying assembly 320 onto the second conveying assembly 360.

A bearing platform 331 is arranged close to the stacking part 330, and is configured to carry the first press 210. The first mechanical arm 340 is configured to retrieve the first press 210 laid on the terminal end of the first conveying assembly 320, and place the first press 210 on the bearing platform 331.

Specifically, the second press 220 is retrieved by the second gripping part 347, conveyed by the second conveying assembly 360, and placed on the front film 140 of the solar cell string 100 laid on the starting end of the first conveying assembly 320 by the first gripping part 346.

Figure 14:
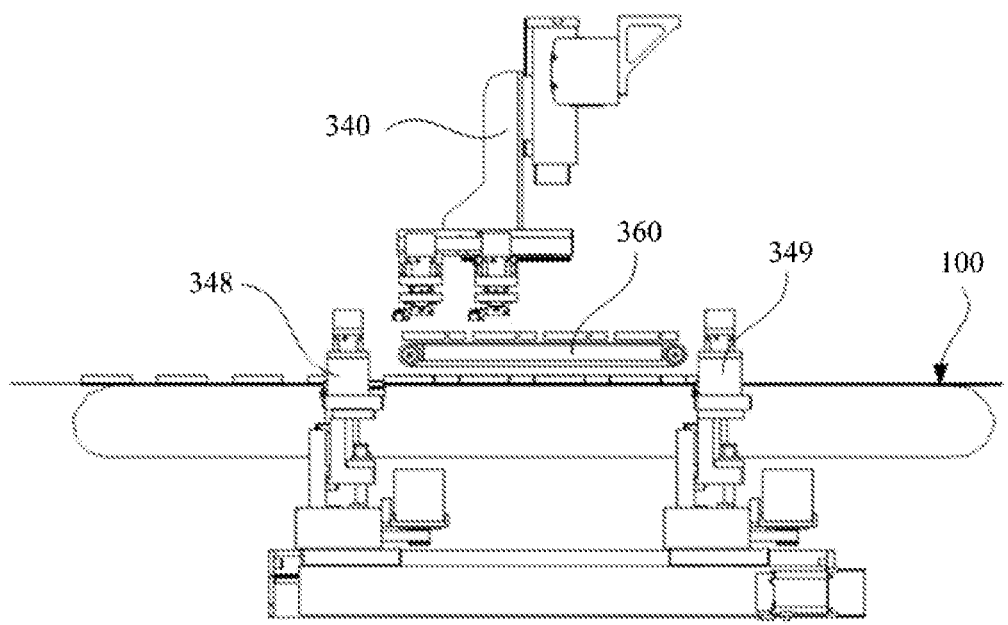
FIG. 14 schematically depicts the device according to an embodiment of the disclosure when adopting a fourth press arrangement scheme.

In an embodiment, referring to FIG. 14, the second conveying assembly 360 is configured to carry and convey the first press 210 and the second press 220. The second mechanical arm 350 includes a third gripping part 348 and a fourth gripping part 349. The third gripping part 348 is arranged at the head end of the second conveying assembly 360. The fourth gripping part 349 is arranged at the tail end of the second conveying assembly 360. The third gripping part 348 is arranged closer to the starting end of the first conveying assembly 320 than the fourth gripping part 349. The third gripping part 348 is configured to place the second press 220 on the second conveying assembly 360 onto the front film 140 of another laying unit 160 at the starting end of the first conveying assembly 320. The fourth gripping part 349 is arranged closer to the terminal end of the first conveying assembly 320 than the third gripping part 348. The fourth gripping part 349 is configured to place the first press 210 and the second press 220 laid on the terminal end of the first conveying assembly 320 onto the second conveying assembly 360. The bearing platform 331 is arranged close to the stacking part 330. The first mechanical arm 340 is configured to retrieve the first press 210 laid on the second conveying assembly 360, and place the first press 210 on the bearing platform 331.

Specifically, the fourth gripping part 349 can place the first press 210 and the second press 220 laid on the terminal end of the first conveying assembly 320 onto the second conveying assembly 360 at the same time. At this time, the second conveying assembly 360 is configured to carry the first press 210 and the second press 220. The second press 220 can be placed by the third gripping part 348 arranged at the starting end of the first conveying assembly 320. For example, the third gripping part 348 places the second press 220 on the second conveying assembly 360 onto the front film 140 of the solar cell string 100 at the starting end of the first conveying assembly 320, at this time, the first press 210 on the second conveying assembly 360 is retrieved by the first mechanical arm 340 and placed on the bearing platform 331, facilitating to be clamped by the stacking part 330.

It should be understood that the first press 210 can be directly clamped from the second conveying assembly 360, and then placed on the front film 140 of the solar cell string 100 at the starting end of the first conveying assembly 320.

In another embodiment, the first mechanical arm 340 includes a fourth driving unit, a fifth driving unit and a clamping part 344. The fourth driving unit is configured to drive the clamping part 344 to move along a fourth preset direction. The fifth driving unit is configured to drive the clamping part 344 to move along a fifth preset direction. The fourth preset direction is perpendicular to the conveying direction of the first conveying assembly 320, and is parallel to a bearing surface of the second conveying assembly 360. The fifth preset direction is perpendicular to the bearing surface of the second conveying assembly 360.

Specifically, since the first mechanical arm 340 is configured to clamp the first press 210 and place the first press 210 on the bearing platform 331, the first mechanical arm 340 moves up and down, and reciprocates in one direction. Accordingly, the first mechanical arm 340 only requires two driving units, that is, the fourth driving unit and the fifth driving unit. The clamping part 344 is configured to clamp the first press 210. The fourth driving unit and the fifth driving unit are configured to drive the first mechanical arm 340 to move up and down, and to reciprocate in one direction. Specifically, the fourth driving unit is configured to drive the clamping part 344 to move from the second conveying assembly 360 to the bearing platform 331. The fifth driving unit is configured to drive the clamping part 344 to perform a lifting movement. The bearing platform 331 is arranged close to the stacking part 330, and is perpendicular to the conveying direction of the first conveying assembly 320, such that the fourth driving unit only need to reciprocate along a direction perpendicular to the conveying direction of the first conveying assembly 320.

It should be noted that the specific moving direction of the fourth driving unit is not limited, which can be adjusted according to a position of the bearing platform 331. For example, when the bearing platform 331 is arranged on the extension line of the conveying direction of the second conveying assembly 360 or forms an angle with respect to the conveying direction of the second conveying assembly 360, the moving direction of the fourth driving unit from the bearing platform 331 to the second conveying assembly 360 can be adjusted.

Figure 15:
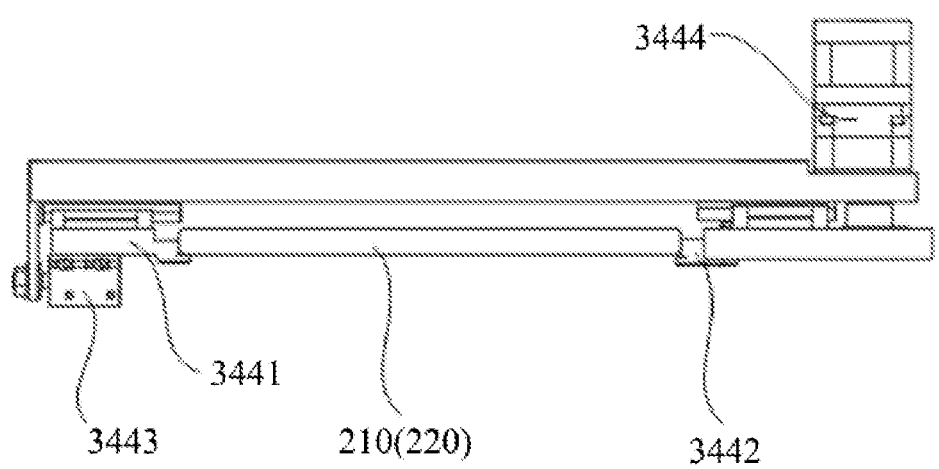
FIG. 15 is a structure diagram of a clamping part of the device according to an embodiment of the disclosure.

In an embodiment, referring to FIG. 15, the first gripping part 346, the second gripping part 347, the third gripping part 348 and the fourth gripping part 349 each includes a gripping portion corresponding to the first press 210 or the second press 220. The gripping portion includes a first adjustment plate 3441, a second adjustment plate 3442, a first driving part 3443 and a second driving part 3444. The first driving part 3443 is connected to the first adjustment plate 3441, and is configured to drive the first adjustment plate 3441 to move. The second driving part 3444 is connected to the second adjustment plate 3442, and is configured to drive the second adjustment plate 3442 to move. The first driving part 3443 and the second driving part 3444 are configured to drive the first adjustment plate 3441 and the second adjustment plate 3442 to move toward or away from each other, so as to clamp the first press 210 or the second press 220.

During clamping, two ends of a to-be-clamped press press against the first adjustment plate 3441 and the second adjustment plate 3442, respectively, such that the two ends are adjusted. The clamping part is configured to adjust the to-be-clamped press through the first adjustment plate 3441 and the second adjustment plate 3442, improving a laying efficiency of the press.

In an embodiment, the clamping part includes a sucking disc or a clamping jaw to clamp the first press 210 or the second press 220, or the first press 210 and the second press 220. The number of the sucking disc or a clamping jaw is one or more.

Figure 16:
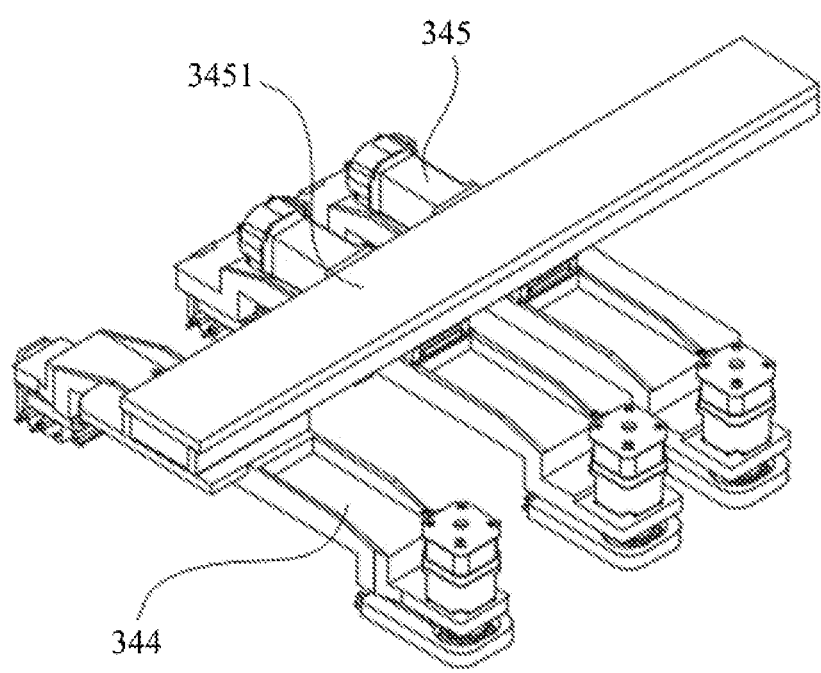
FIG. 16 is a structure diagram of a third gripping part of the device according to an embodiment of the disclosure.

In an embodiment, referring to FIG. 16, the fourth gripping part 349 is configured to place the first press 210 and the second press 220 laid on the terminal end of the first conveying assembly 320 onto the second conveying assembly 360. At this time, the fourth gripping part 349 clamps the first press 210 and the second press 220, simultaneously. In an embodiment, the fourth gripping part 349 includes a sliding rod 3451, a third driving part 345 and a plurality of clamping parts. The plurality of clamping parts are capable of sliding along the sliding rod 3451. The third driving part 345 is configured to drive the plurality of clamping parts 344 to move, so as to adjust a distance between the first press 210 and the second press 220.

Described above are merely illustrative of the disclosure, and are not intended to limit the disclosure. Although the disclosure has been illustrated and described in detail above, it should be understood that those skilled in the art could still make modifications and changes to the embodiments of the disclosure. Those modifications, replacements and improvements made by those skilled in the art based on the content disclosed herein without departing from the scope of the disclosure shall fall within the scope of the present disclosure defined by the appended claims.

What is claimed is:

1. A method for a fixed connection of a solar cell string, comprising:
   laying the solar cell string; and
   performing a melting-solidification operation;
   wherein the laying of the solar cell string comprises:
   stacking a back film, a first solder ribbon, a solar cell, a second solder ribbon and a front film to form a solar cell unit; wherein the first solder ribbon comprise a first solder ribbon section and a second solder ribbon section connected with each other; the second solder ribbon comprises a third solder ribbon section and a fourth solder ribbon section connected with each other;
   stacking a back film, a first solder ribbon, a solar cell, a second solder ribbon and a front film to form a solar cell unit; wherein the first solder ribbon comprise a first solder ribbon section and a second solder ribbon section connected with each other; the second solder ribbon comprises a third solder ribbon section and a fourth solder ribbon section connected with each other;
   wherein the stacking comprises:
   laying the second solder ribbon section on the back film;
   laying the solar cell on the second solder ribbon section;
   laying the third solder ribbon section on the solar cell; and
   laying the front film on the third solder ribbon section to form the solar cell unit;
   connecting N solar cell units in series to form the solar cell string, wherein N is an integer equal to or greater than 2; and
   placing a first press on the front film to form a laying unit, and placing a second press on the front film of the laying unit, wherein the first press presses against at least a middle portion of the front film; and the second press presses against at least a head portion of the front film; and the head portion is an end of the front film covering the third solder section; and
   the melting-solidification operation is performed through steps of:
   after the first press is placed on the front film, subjecting the laying unit to melting and solidification; placing the second press on the laying unit; transferring the laying unit with the second press to a melting-solidification zone for melting and solidification to complete fixed connection of the solar cell string; and removing the first press and the second press from the front film of the solar cell string; or
   after the first press and the second press are both placed on the front film of the laying unit; transferring the laying unit with the second press to the melting-solidification zone for melting and solidification to complete fixed connection of the solar cell string; and removing the first press and the second press from the front film of the solar cell string.

2. The method of claim 1, wherein the second press is placed through steps of:

after placing the first press, conveying the laying unit in a moving direction of the solar cell string, and placing the second press on the laying unit;

laying another solar cell unit at an end of the laying unit away from the head portion of the front film, and connecting two solar cell units in series to form the solar cell string; and successively placing another first press and another second press on the another solar cell unit.

3. The method of claim 1, wherein the first press presses against the middle portion and a tail portion of the front film, and the second press presses against the head portion of the front film; or the first press presses against the middle portion of the front film, and the second press presses against the head portion and the tail portion of the front film; or the first press presses against the middle portion of the front film, and the second press presses against the head portion of the front film and a tail portion of a previous front film;

wherein the head portion and the tail portion of the same front film are symmetrical with respect to the middle portion.

4. The method of claim 1, wherein the laying of the solar cell string comprises:

laying another solar cell on the fourth solder ribbon section on a next back film while placing the first press and the front film on the third solder ribbon section to form the laying unit;

conveying the laying unit in a moving direction of the solar cell string, and placing the second press on the laying unit;

conveying the solar cell unit with the first press and the second press to the melting-solidification zone for melting and solidification until the front film and the back film are solidified; and removing the first press and the second press from the front film of the solar cell unit.

5. The method of claim 1, wherein in the melting-solidification operation, the solar cell unit is heated and cooled integrally; and the melting-solidification zone comprises a heating subzone and a cooling subzone; and the solar cell unit with the first press and the second press successively passes through the heating subzone and the cooling subzone to allow melting and solidification of the front film and back film.

6. The method of claim 1, wherein after the first press is placed, the solar cell unit is successively heated and cooled, such that the middle portion of the front film and a portion of the back film corresponding to the middle portion of the front film are solidified.

* * * * *